(12) United States Patent
Huang

(10) Patent No.: US 11,079,881 B2
(45) Date of Patent: Aug. 3, 2021

(54) SIGNAL PROCESSING CIRCUIT AND SYSTEM

(71) Applicant: NOVATEK Microelectronics Corp., Hsin-Chu (TW)

(72) Inventor: Min Huang, Taoyuan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 75 days.

(21) Appl. No.: 16/439,719

(22) Filed: Jun. 13, 2019

(65) Prior Publication Data

US 2019/0294277 A1 Sep. 26, 2019

Related U.S. Application Data

(63) Continuation-in-part of application No. 16/243,105, filed on Jan. 9, 2019, now Pat. No. 10,901,552.

(60) Provisional application No. 62/615,944, filed on Jan. 10, 2018, provisional application No. 62/684,721, filed on Jun. 13, 2018.

(51) Int. Cl.
| | |
|---|---|
| *G06F 3/044* | (2006.01) |
| *H03M 1/12* | (2006.01) |
| *H03F 3/70* | (2006.01) |
| *H03F 3/45* | (2006.01) |
| *G01R 27/26* | (2006.01) |

(52) U.S. Cl.
CPC ......... *G06F 3/044* (2013.01); *G01R 27/2605* (2013.01); *H03F 3/45* (2013.01); *H03F 3/70* (2013.01); *H03M 1/12* (2013.01)

(58) Field of Classification Search
CPC ....... G06F 3/044; H03M 1/12; G01R 27/2605
See application file for complete search history.

(56) References Cited

U.S. PATENT DOCUMENTS

| | | | |
|---|---|---|---|
| 8,942,309 B1 * | 1/2015 | Ware | H04L 25/14 375/295 |
| 2005/0040886 A1 * | 2/2005 | Fujimoto | H03F 3/005 330/9 |
| 2006/0284603 A1 * | 12/2006 | Nehrig | G01D 5/24 320/167 |
| 2009/0032312 A1 * | 2/2009 | Huang | G06F 3/044 178/18.06 |
| 2016/0344403 A1 * | 11/2016 | Sonnaillon | H02M 3/157 |
| 2018/0052558 A1 | 2/2018 | Wang | |
| 2018/0219476 A1 * | 8/2018 | Kain | G01R 15/146 |

* cited by examiner

*Primary Examiner* — Dominic E Hawkins
(74) *Attorney, Agent, or Firm* — Winston Hsu

(57) ABSTRACT

A signal processing circuit for processing a sensing signal from a sensor includes an amplifier, an input capacitor group, a compensation capacitor group and first/second switch groups. The amplifier, coupled to a first floating node and a second floating node, is configured to amplify the sensing signal coupled from the first floating node and the second floating node. The first switch group is coupled between a first node group and the first and second floating nodes. The second switch group is coupled between a second node group and the first node group. The input capacitor group is coupled to the second node group and an input node group, and configured to receive the sensing signal coupled from the input node group. The compensation capacitor group is coupled between a compensation node group and the second node group, and configured to receive a compensation signal coupled from the compensation node group.

22 Claims, 15 Drawing Sheets

SIGNAL PROCESSING CIRCUIT AND SYSTEM

CROSS REFERENCE TO RELATED APPLICATIONS

This application claims the benefit of U.S. Provisional Application No. 62/684,721, filed on Jun. 13, 2018, and is a continuation-in-part application of U.S. application Ser. No. 16/243,105, filed on Jan. 9, 2019, which further claims the benefit of U.S. Provisional Application No. 62/615,944. The contents of these applications are incorporated herein by reference.

BACKGROUND OF THE INVENTION

1. Field of the Invention

The present invention relates to a signal processing circuit and system, and more particularly, to a signal processing circuit and system for a fingerprint sensor.

2. Description of the Prior Art

With advancements in technology, mobile devices such as smart phones, tablets, laptops, GPS navigation systems and electronic books have become indispensable in our daily life. Compared with conventional mobile phones that only have communication functions, modern mobile devices combine various functions such as communication, networking, photographing, games and data processing. This type of multifunctional design is more attractive to consumers. Fingerprint recognition is a popular function for security and privacy in various electronic devices including mobile devices, and can be implemented in different techniques such as capacitive sensing, optical (image sensing), thermal, ultrasonic, etc. For example, a mobile phone may have a fingerprint recognition interface built into a home button or in a dedicated region to detect user fingerprint.

Among those fingerprint recognition techniques, the capacitive fingerprint recognition scheme has become a popular way. With capacitive fingerprint recognition, the sensing pixels in a fingerprint sensor may fetch the capacitance of a touch finger, where the capacitance is processed and converted into a voltage signal which is further forwarded to a follow-up circuit such as an analog front-end (AFE) circuit to be recognized. The voltage signals obtained from the pixels usually include a common-mode (CM) part and a differential-mode (DM) part, wherein the DM part is a useful signal, and the CM part is a useless signal and should be removed in the AFE circuit.

The AFE circuit may apply compensation capacitors with a rising compensation signal to remove most of the unwanted CM part. However, due to process variations, there may be mismatch between the compensation capacitors and/or input capacitors, such that the CM part may not be entirely canceled. Thus, there is a need for improvement over the prior art.

SUMMARY OF THE INVENTION

It is therefore an objective of the present invention to provide a signal processing circuit and system which are capable of processing a sensing signal from a fingerprint sensor, to entirely remove the common-mode part of the sensing signal by swapping the switch configuration and averaging the output signals.

An embodiment of the present invention discloses a signal processing circuit for processing a sensing signal from a sensor. The signal processing circuit comprises an amplifier, a first switch group, a second switch group, an input capacitor group and a compensation capacitor group. The amplifier, coupled to a first floating node and a second floating node, is configured to amplify the sensing signal coupled from the first floating node and the second floating node. The first switch group is coupled between a first node group and the first floating node and the second floating node. The second switch group is coupled between a second node group and the first node group. The input capacitor group is coupled to the second node group and an input node group, and configured to receive the sensing signal coupled from the input node group. The compensation capacitor group is coupled between a compensation node group and the second node group, and configured to receive a compensation signal coupled from the compensation node group.

Another embodiment of the present invention discloses a signal processing system for processing a sensing signal from a sensor. The signal processing system comprises a signal processing circuit, an analog to digital converter (ADC) and a digital circuit. The signal processing circuit comprises an amplifier, a first switch group, a second switch group, an input capacitor group and a compensation capacitor group. The amplifier, coupled to a first floating node and a second floating node, is configured to amplify the sensing signal coupled from the first floating node and the second floating node. The first switch group is coupled between a first node group and the first floating node and the second floating node. The second switch group is coupled between a second node group and the first node group. The input capacitor group is coupled to the second node group and an input node group, and configured to receive the sensing signal coupled from the input node group. The compensation capacitor group is coupled between a compensation node group and the second node group, and configured to receive a compensation signal coupled from the compensation node group. The ADC is coupled to the signal processing circuit. The digital circuit is coupled to the ADC.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
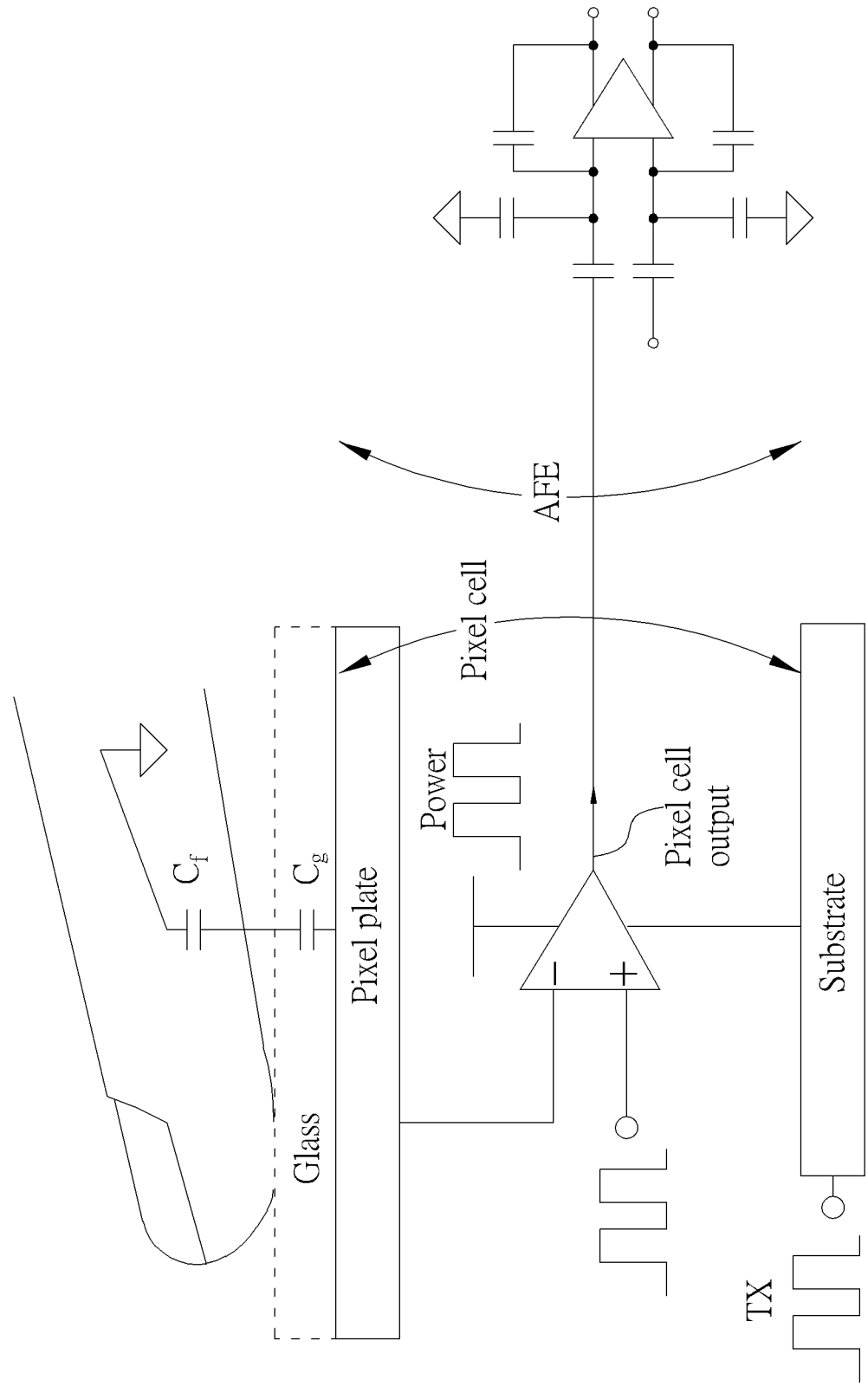
FIG. 1 is a schematic diagram of a fingerprint sensing circuit.

Please refer to FIG. 1, which is a schematic diagram of an exemplary fingerprint sensing circuit. The exemplary fingerprint sensing circuit includes a pixel array and an analog front-end (AFE) circuit, where only one pixel cell in the pixel array is illustrated for simplicity. In the pixel array, each pixel cell includes a sensing electrode (as the pixel plate shown in FIG. 1) and a charge amplifier (or called a pixel amplifier). Multiple pixel cells can be switched time-divisionally to output respective sensing signals to the AFE circuit. A finger touching the fingerprint sensor is considered as being connected to the universal ground. By using the transmitting signal TX (or called excitation signal), the pixel array may obtain information of a finger capacitance $C_f$ and convert the finger capacitance information into the sensing signal (which may be a voltage signal) as the output signal of the charge amplifier. The sensing signal of pixel includes a common-mode (CM) part and a differential-mode (DM) part.

The charge amplifier illustrated in FIG. 1 may have a differential circuit structure, where the inverting input terminal of the charge amplifier receives the signal that carries the information of the finger capacitance $C_f$, and the non-inverting input terminal of the charge amplifier receives a reference voltage. A transmitting signal TX such as a square wave signal is supplied to a substrate where the charge amplifier circuit is disposed, and voltage signals including the power supply voltage, ground voltage and reference voltage have a shifted level based on the transmitting signal TX. In other words, all these voltage signals toggle following the transmitting signal TX (i.e., their voltage levels transit at the same time). The transmitting signal TX may be generated by a charge pump circuit (not shown in FIG. 1) built in the fingerprint sensing circuit, and its p-p amplitude is AVDD or any possible voltage value. The output terminal of the pixel cell (i.e., the output terminal of the charge amplifier) is connected to one of the input terminals of the AFE circuit.

Figure 2:
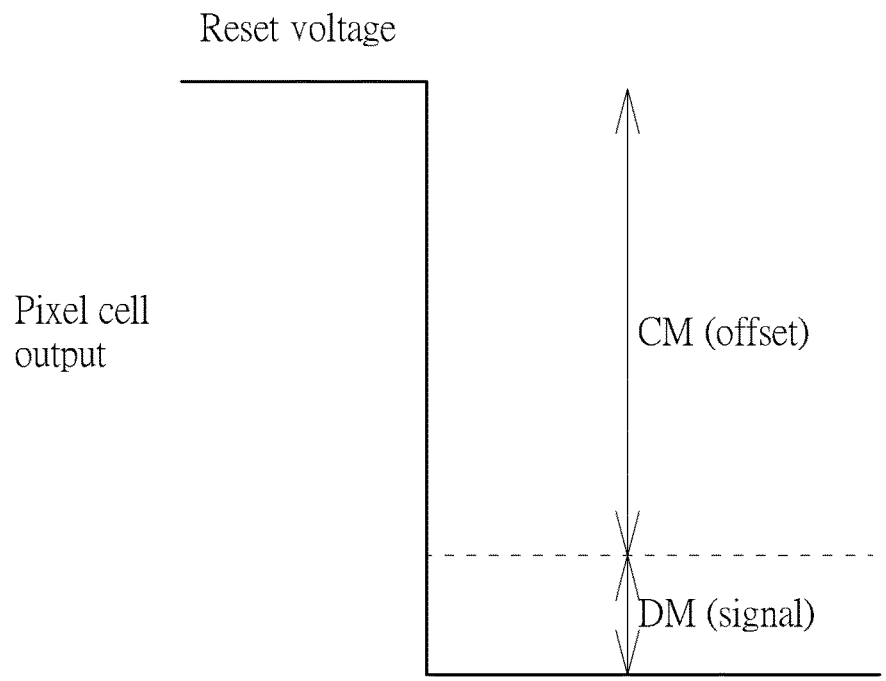
FIG. 2 is a schematic diagram of the output signal of the pixel cell outputted to the AFE circuit.

Please refer to FIG. 2, which is a schematic diagram of the output signal of the pixel cell. The output signal is outputted to the AFE circuit. The fingerprint sensor is protected (or isolated) by a protection layer which may be made of glass or coating, as shown in FIG. 1. Thus, the capacitance information carried out by the pixel cell is with respect to the capacitance of the protection layer, $C_g$, and the finger capacitance $C_f$ in series, so the DM part (with respect to the finger capacitance $C_f$) is quite weaker than the CM part. Further, the toggle of the transmitting signal TX may generate a large voltage variation in the CM part.

In FIG. 1-FIG. 2, when the finger does not touch yet, only the CM part signal appears at the output terminal of the pixel cell. When the finger contacts the fingerprint sensor and the transmitting signal TX is in a high level, the pixel cell outputs a reset voltage which equals $V_{CM}$ (e.g., 1V) plus AVDD (e.g., 3V, which is the amplitude of the transmitting signal TX). When the level of the transmitting signal TX transits from high to low, the output signal of the pixel cell also transits from high to low following the falling edge of the transmitting signal TX, and therefore the output signal of the pixel cell carries out the information of the finger capacitance $C_f$. As shown in FIG. 2, every time when the level of the transmitting signal TX transits from high to low, the output signal as shown in FIG. 2 may be generated in the output terminal of the pixel cell. The downward level of the output signal of the pixel cell may include the magnitude of TX falling (i.e., the CM (offset) shown in FIG. 2, which equals the p-p amplitude AVDD of the transmitting signal TX) and the magnitude of the DM part (i.e., the voltage signal generated from the finger capacitance $C_f$).

Figure 3:
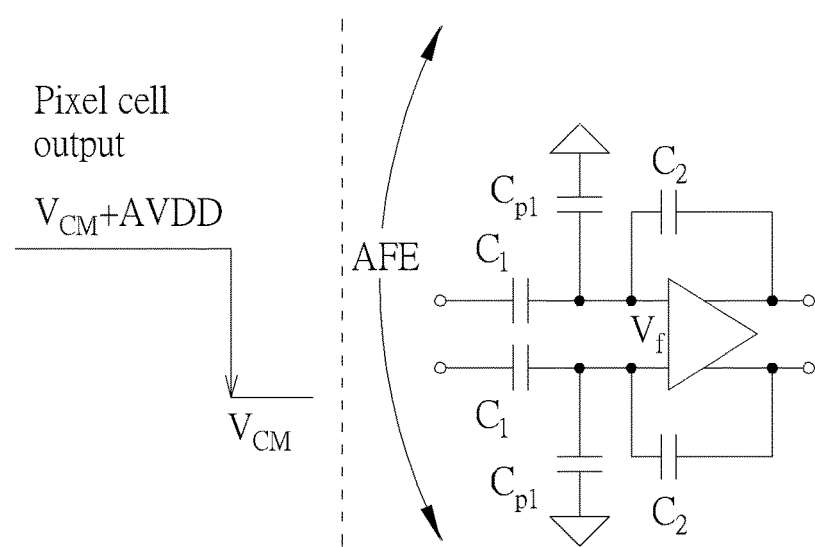
FIG. 3 is a schematic diagram of a circuit stage next to the pixel cell with absence of the CM voltage compensation scheme.

Please refer to FIG. 3, which is a schematic diagram of a circuit stage next to the pixel cell (i.e., the AFE circuit) with absence of the CM voltage compensation scheme. The influences on the AFE circuit in the next stage generated by the CM part of the output signal of the pixel cell are analyzed according to FIG. 3. Without the CM voltage compensation scheme, every time when the level of the transmitting signal TX transits from high to low, the output signal of the pixel cell may possess an excessively large voltage level variation due to the falling CM voltage, which causes a significant downward voltage level variation in the voltage $V_f$ on the floating node of the AFE circuit (i.e., the input terminal of the differential amplifier in the AFE circuit), as described by:

$$V_f = V_{CN} - \frac{C_1}{C_1 + C_{p1} + C_2} \cdot AVDD;$$

wherein $C_1$ is the input capacitance of the differential amplifier, $C_{p1}$ is the parasitic capacitance in the input terminal of the differential amplifier, $C_2$ is the feedback capacitance of the differential amplifier, and AVDD is the peak-to-peak voltage amplitude of the transmitting signal TX. The voltage level variation of $V_f$ (as $-C_1/(C_1+C_{p1}+C_2)\times AVDD$) is determined based on the ratio of the capacitances $C_1$ and $C_2$. Under the situation where the amplifier gain=$C_1/C_2$ which is greater than or equal to 1, the voltage $V_f$ on the input terminal of the differential amplifier may become smaller than zero ($V_f<0V$), and the differential amplifier cannot operate normally under $V_f<0V$. This situation results in signal saturation occurring in the output signal of the AFE circuit.

A compensation capacitor group receiving a compensation signal may be disposed, to cancel the CM part of the sensing signal. The compensation scheme is capable of maintaining floating nodes coupled to the input terminals of the amplifier at a constant voltage level. With suitable deigns of the waveforms of the compensation signal and sensing signal, the floating nodes coupled to the input terminals of the amplifier may be maintained at a constant CM voltage level, preventing signal saturation from occurring in the output signal of the AFE circuit. To achieve this, the compensation signal may be generated according to the CM part of the sensing signal. More specifically, a variation direction of the compensation signal may be arranged opposite to a variation direction of the CM part of the sensing signal. In addition, an absolute amount of the variation of the compensation signal may be arranged substantially equal to an absolute amount of the variation of the CM part of the sensing signal.

Figure 4:
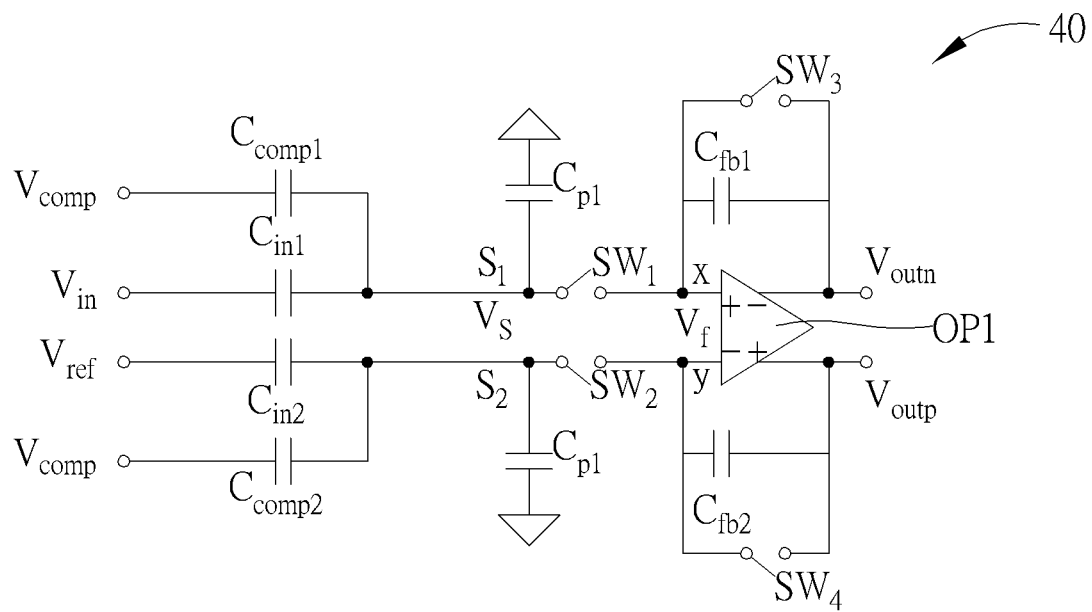
FIG. 4 is a schematic diagram of an AFE circuit with a differential circuit structure.

FIG. 4 illustrates an AFE circuit 40 with a differential circuit structure as an example. As shown in FIG. 4, the AFE circuit 40 includes a capacitor group, an amplifier OP1, an input switch group $SW_1$-$SW_2$ and a feedback switch group $SW_3$-$SW_4$. As for the differential structure, the capacitor group may include two input capacitors $C_{in1}$ and $C_{in2}$, two compensation capacitors $C_{comp1}$ and $C_{comp2}$, and two feedback capacitors $C_{fb1}$ and $C_{fb2}$, and the amplifier OP1 is a differential amplifier. The input switches $SW_1$ and $SW_2$ are coupled between the input capacitor $C_{in1}$ and the non-inverting input terminal (+) of the amplifier OP1 and between the other input capacitor $C_{in2}$ and the inverting input terminal (−) of the amplifier OP1, respectively. The feedback switch $SW_3$ is coupled between the non-inverting input terminal (+) and the inverting output terminal (−) of the amplifier OP1. The feedback switch $SW_4$ is coupled between the inverting input terminal (−) and the non-inverting output terminal (+) of the amplifier OP1. The input capacitor $C_{in1}$ and the compensation capacitor $C_{comp1}$ are coupled to a node S1, which is further coupled to the non-inverting input terminal of the amplifier OP1 (i.e., the floating node x) via the input switch $SW_1$. The input capacitor $C_{in2}$ and the compensation capacitor $C_{comp2}$ are coupled to a node S2, which is further coupled to the inverting input terminal of the amplifier OP1 (i.e., the floating node y) via the input switch $SW_2$. $C_{p1}$ refers to parasitic capacitors in the input terminals of the amplifier OP1. $V_{in}$ is an input signal of the AFE circuit 40. The input signal $V_{in}$ may be a sensing signal generated from a fingerprint sensor and outputted by a pixel cell as shown in FIG. 1. $V_{ref}$ is a reference signal such as a pulse signal or square wave signal. $V_{outp}$ and $V_{outn}$ are output signals of the amplifier OP1.

In the input path regarding the input signal $V_{in}$, the input capacitor $C_{in1}$ is configured to couple the input signal $V_{in}$ to the node S1. In the corresponding compensation path, the compensation capacitor $C_{comp1}$ is configured to couple a compensation signal $V_{comp}$ to the node S1. Similarly, in the input path and compensation path regarding the reference signal $V_{ref}$, the input capacitor $C_{in2}$ is configured to couple the reference signal $V_{ref}$ and the compensation capacitor $C_{comp2}$ is configured to couple the compensation signal $V_{comp}$ to the node S2. The amplifier OP1, coupled to the nodes S1 and S2 via the input switches $SW_1$ and $SW_2$, respectively, is configured to amplify the input signal $V_{in}$ coupled from the input capacitor $C_{in1}$, and more specifically, configured to amplify the DM part with respect to the finger capacitance $C_f$ in the input signal $V_{in}$ and cancel the CM part in the input signal $V_{in}$.

As mentioned above, the compensation signal $V_{comp}$ may be generated according to the CM part of the input signal $V_{in}$. More specifically, the variation direction of the compensation signal $V_{comp}$ may be arranged opposite to the variation direction of the CM part of the input signal $V_{in}$, and the absolute amount of the variation of the compensation signal $V_{comp}$ may be arranged substantially equal to the absolute amount of the variation of the CM part of the input signal $V_{in}$. With identical capacitance values of the input capacitors $C_{in1}$ and $C_{in2}$ and the compensation capacitors $C_{comp1}$ and $C_{comp2}$, the signal magnitude coupled to the nodes S1 and S2 may be perfectly canceled with the equal absolute value and opposite variation direction between the input signal $V_{in}$ and the compensation signal $V_{comp}$. However, due to process variations, there may be mismatch between capacitance values of the compensation capacitors $C_{comp1}$ and $C_{comp2}$ and/or the input capacitors $C_{in1}$ and $C_{in2}$ and the mismatch degree is determined by the capacitance values and the layout structure. The mismatch causes that the CM part cannot be entirely canceled on the nodes S1 and S2.

In order to solve the mismatch problem, two swap switch groups may be included in the signal path. The swap switch groups allow the CM part to be canceled entirely after operations of a swapping phase and a non-swapping phase. In the non-swapping phase, the swap switch groups may be in a non-swapping configuration; and in the swapping phase, the swap switch groups may be in a swapping configuration.

Figure 5:
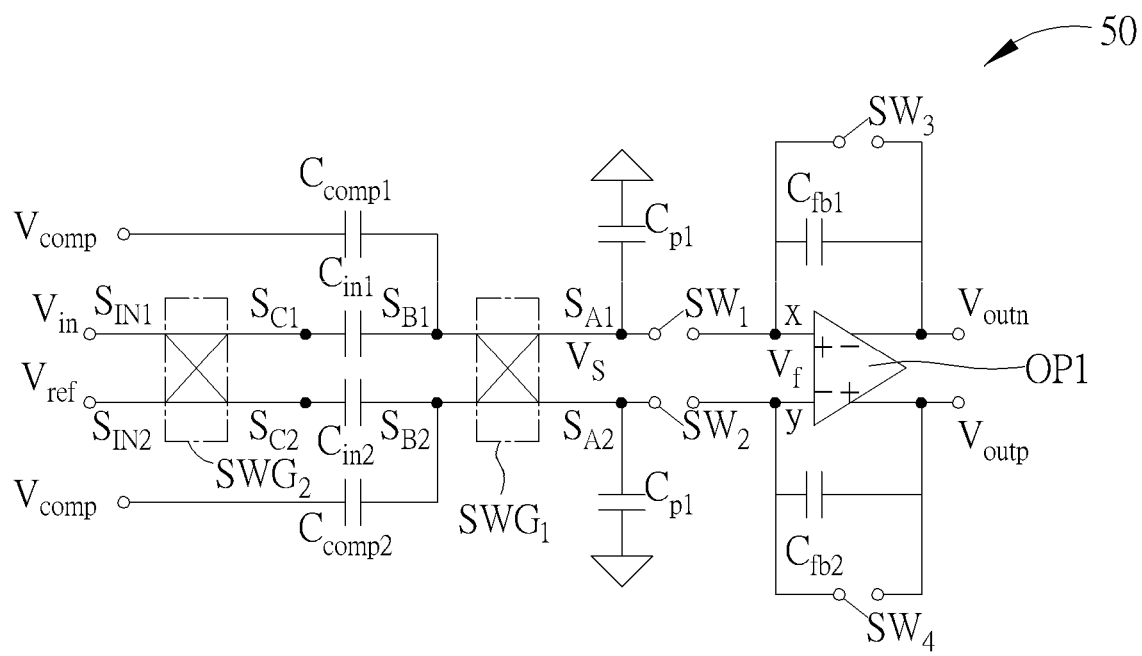
FIG. 5 is a schematic diagram of an AFE circuit according to an embodiment of the present invention.

Please refer to FIG. 5, which is a schematic diagram of an AFE circuit 50 according to an embodiment of the present invention. The circuit structure of the AFE circuit 50 is similar to the circuit structure of the AFE circuit 40, so signals and elements having similar functions are denoted by the same symbols. The difference between the AFE circuit 50 and the AFE circuit 40 is that, the AFE circuit 50 further includes two swap switch groups $SWG_1$ and $SWG_2$. In detail, the input terminals of the amplifier OP1 of the AFE circuit 50 is coupled to the floating nodes x and y. The input switch group $SW_1$-$SW_2$ is coupled between the floating nodes x and y and nodes $S_{A1}$ and $S_{A2}$. The swap switch group $SWG_1$ is coupled between the nodes $S_{A1}$ and $S_{A2}$ and nodes $S_{B1}$ and $S_{B2}$. The input capacitors $C_{in1}$ and $C_{in2}$ are coupled between the nodes $S_{B1}$ and $S_{B2}$ and nodes $S_{C1}$ and $S_{c2}$. The compensation capacitors $C_{comp1}$ and $C_{comp2}$ are coupled between the nodes $S_{B1}$ and $S_{B2}$ and a compensation node group. The swap switch group $SWG_2$ is coupled between the nodes $S_{C1}$ and $S_{C2}$ and an input node group $S_{IN1}$ and $S_{IN2}$. In the structure as shown in FIG. 5, the compensation capacitors $C_{comp1}$ and $C_{comp1}$ may receive the compensation signals $V_{comp}$ coupled from the compensation node group, and the input capacitors $C_{in1}$ and $C_{in2}$ may receive the input signal $V_{in}$ coupled from the input node group $S_{IN1}$ and $S_{IN2}$ through the swap switch group $SWG_2$.

Figure 6A:
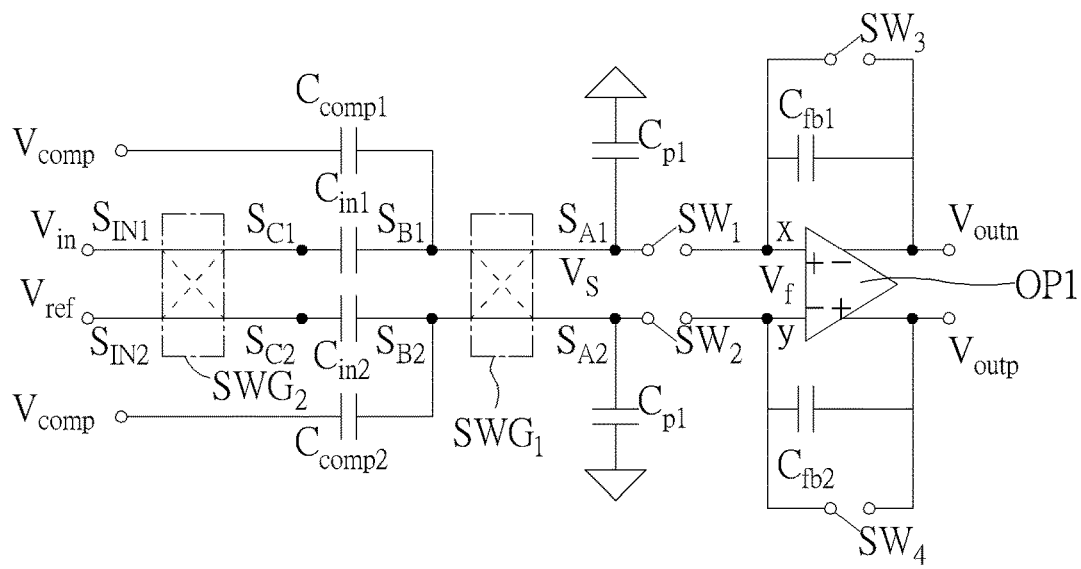
FIG. 6A illustrates the AFE circuit operating in the non-swapping phase.
Figure 6B:
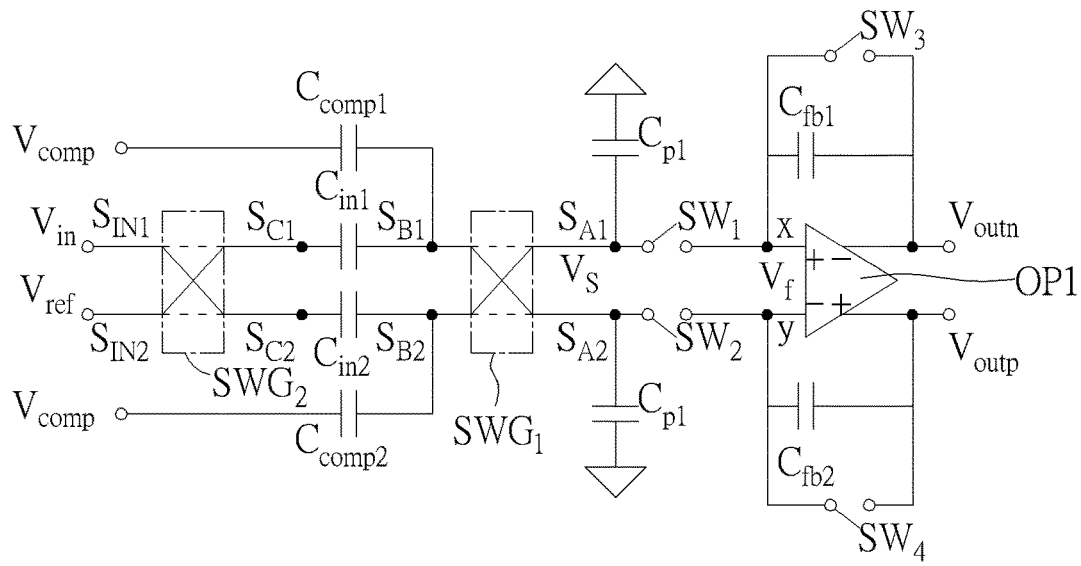
FIG. 6B illustrates the AFE circuit operating in the swapping phase.

FIG. 6A illustrates the AFE circuit 50 operating in the non-swapping phase where the swap switch groups $SWG_1$ and $SWG_2$ are in the non-swapping configuration. In detail, in the non-swapping phase, the swap switch group $SWG_2$ is configured to couple the input node $S_{IN1}$ to the node $S_{C1}$ and couple the input node $S_{IN2}$ to the node $S_{C2}$; and the swap switch group $SWG_1$ is configured to couple the node $S_{B1}$ to the node $S_{A1}$ and couple the node $S_{B2}$ to the node $S_{A2}$. FIG. 6B illustrates the AFE circuit 50 operating in the swapping phase where the swap switch groups $SWG_1$ and $SWG_2$ are in the swapping configuration. In detail, in the swapping phase, the swap switch group $SWG_2$ is configured to couple the input node $S_{IN1}$ to the node $S_{C2}$ and couple the input node $S_{IN2}$ to the node $S_{C1}$; and the swap switch group $SWG_1$ is configured to couple the node $S_{B1}$ to the node $S_{A2}$ and couple the node $S_{B2}$ to the node $S_{A1}$.

Each of the non-swapping phase and the swapping phase further includes a reset phase, at least one compensation phase and a sensing phase, where the input switch group $SW_1$-$SW_2$ and the feedback switch group $SW_3$-$SW_4$ operate to generate the differential output signal $V_{outp}$-$V_{outn}$. FIGS. 7A-7E illustrate the operations of the AFE circuit 50 in the reset phase, the compensation phase and the sensing phase under the non-swapping phase where the swap switch groups $SWG_1$ and $SWG_2$ are in the non-swapping configuration. In these phases, the voltage $V_s$ at the nodes $S_{A1}$ and $S_{A2}$ may undergo the cancellation of the CM voltage. FIG. 8 is a waveform diagram of the voltage signal in each node and the switch control signals in different phases (ph1-ph5) shown in FIGS. 7A-7E. To eliminate the influence caused by that the input signal $V_{in}$ has a negative DC offset value −AVDD due to the transition of the transmitting signal TX, the compensation capacitors $C_{comp1}$ and $C_{comp2}$ may be used in the AFE circuit 50 and the compensation node of each of the compensation capacitors $C_{comp1}$ and $C_{comp2}$ is supplied with a positive DC offset value +AVDD, so that the upward voltage level variation and downward voltage level variation in the node $S_{A1}$ or $S_{A2}$ offset each other. In other words, with the operations of the capacitors in the capacitor group, the CM part of the input signal $V_{in}$ due to the DC offset may be canceled. Therefore, the floating nodes x and y coupled to the input terminals of the amplifier OP1 are maintained at a constant voltage level. With the compensation mechanism, the DM part of the output signal of the pixel cell (i.e., the input signal $V_{in}$) with respect to the finger capacitance $C_f$ together with a stable CM voltage level may be received by an input terminal of the differential amplifier OP1 in the AFE circuit 50.

Figure 7A:
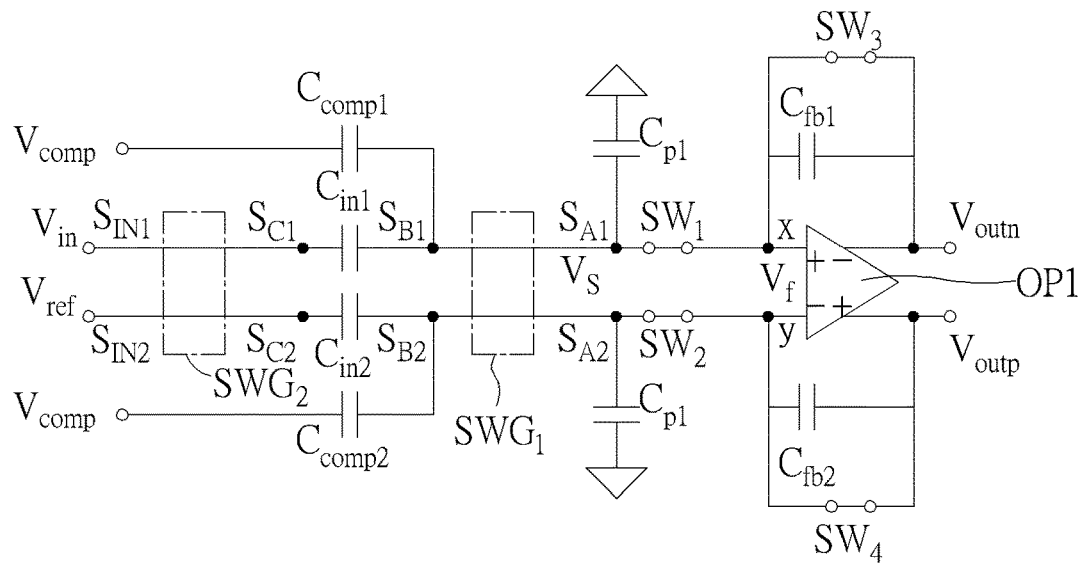
FIGS. 7A-7E are schematic diagrams of the operations of the AFE circuit under the non-swapping phase where the swap switch groups are in the non-swapping configuration.
Figure 8:
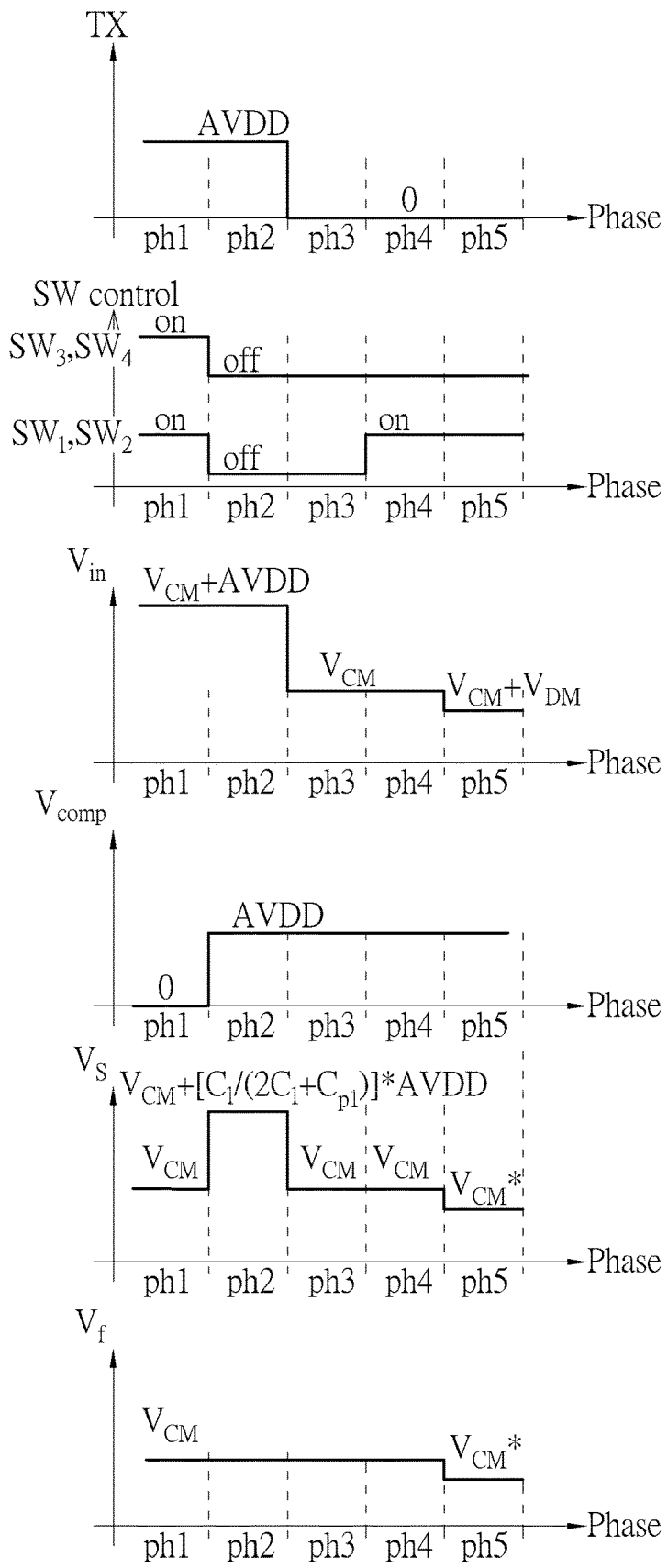
FIG. 8 is a waveform diagram of the voltage signal in each node and the switch control signals in different phases shown in FIGS. 7A-7E.
Figure 9A:
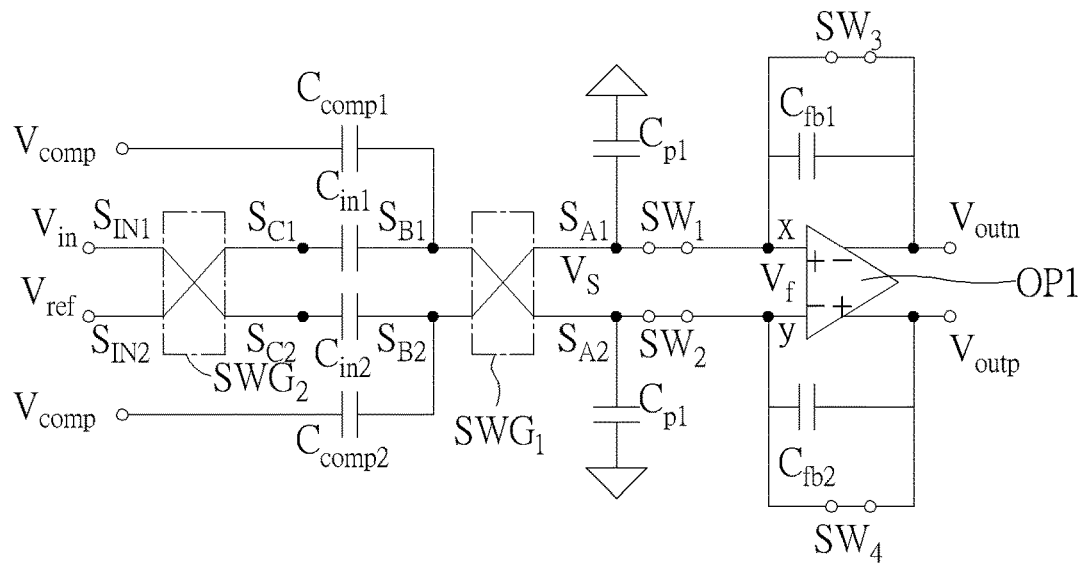
FIGS. 9A-9E are schematic diagrams of the operations of the AFE circuit under the swapping phase where the swap switch groups are in the swapping configuration.
Figure 9B:
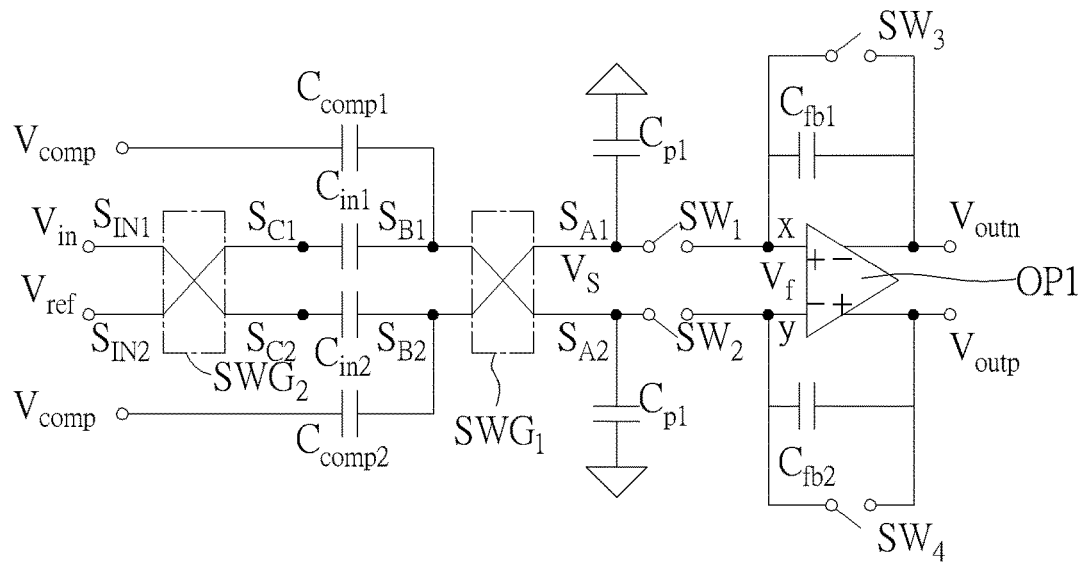
Figure 9C:
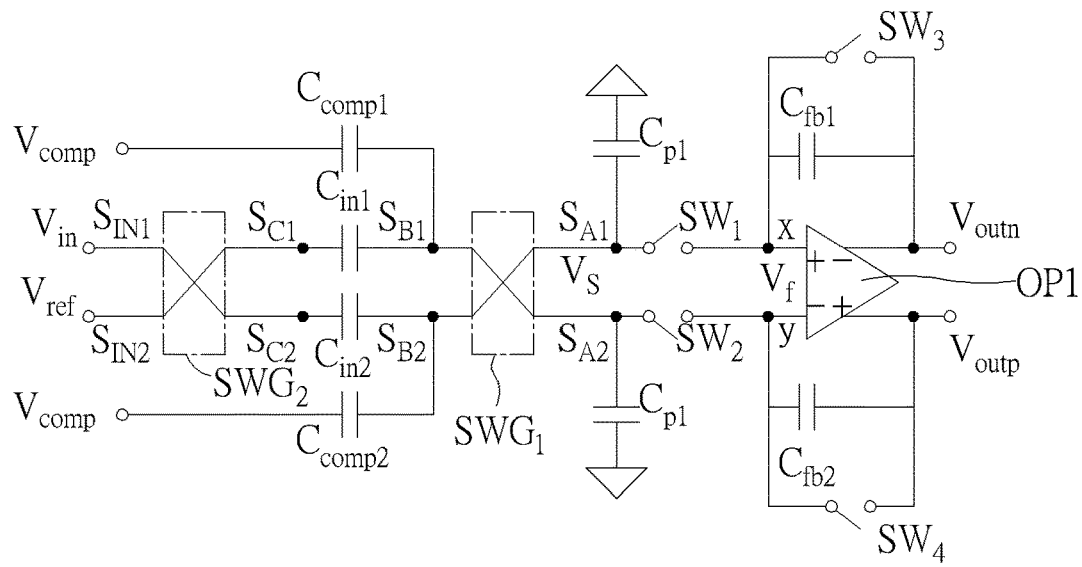
Figure 9D:
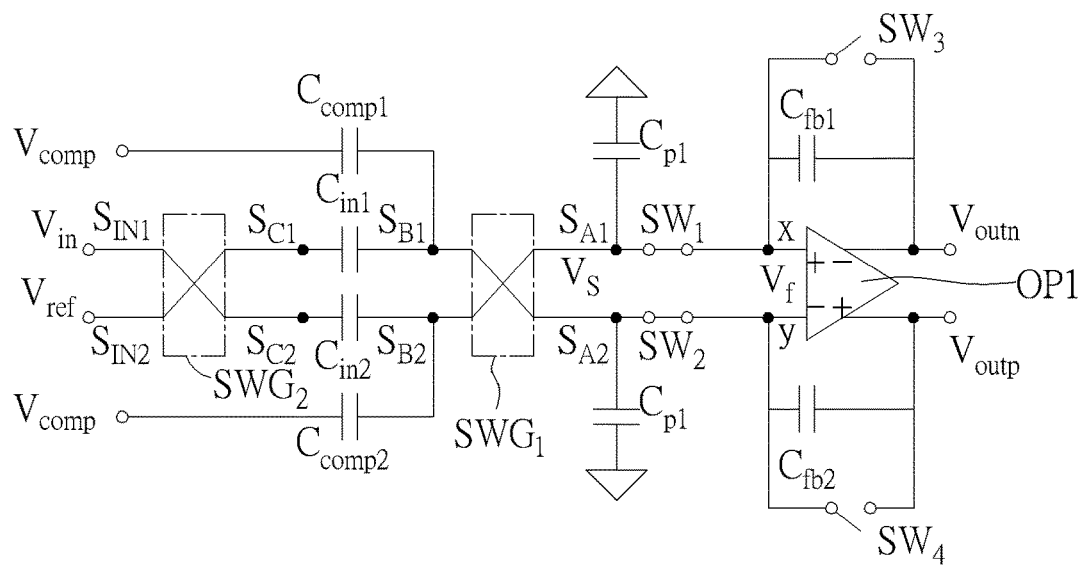
Figure 9E:
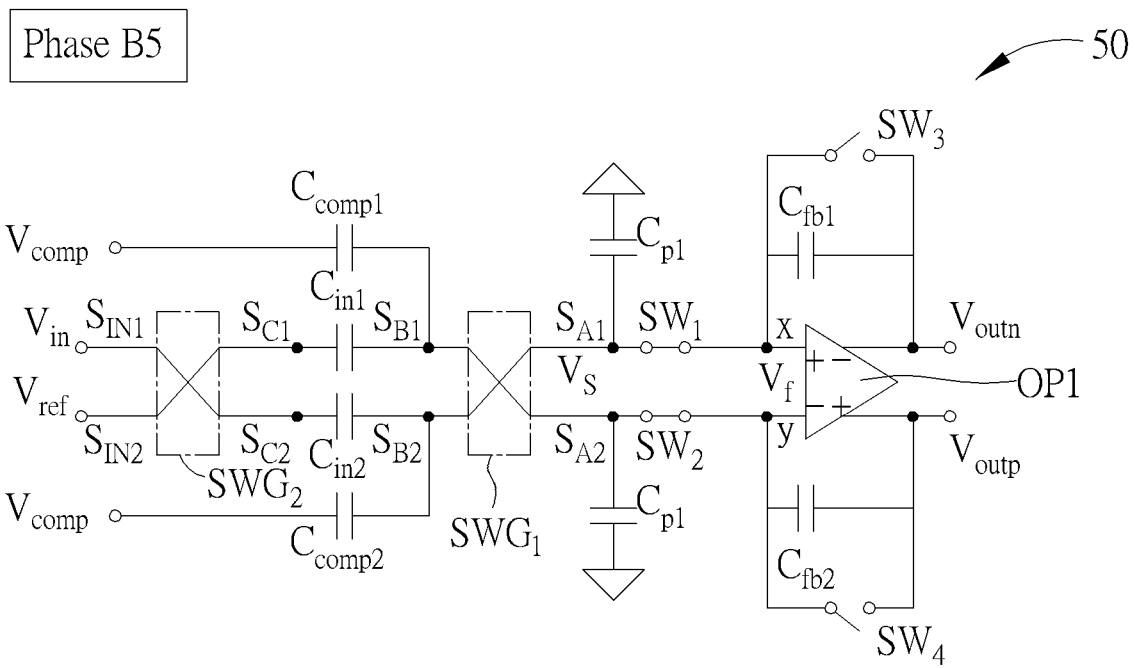

Please refer to FIGS. 7A and 8, where phase A1 is a reset phase, during which the switches $SW_1$-$SW_4$ are turned on. More specifically, the input switches $SW_1$ and $SW_2$ may turn on the signal paths between the nodes $S_{A1}$ and $S_{A2}$ and the floating nodes x and y. In this phase, the transmitting signal TX is at high level, and the pixel cell performs reset. In the charge amplifier circuit of the fingerprint sensing circuit, a reset switch (omitted in FIG. 1) is connected between the non-inverting input terminal and the output terminal of the charge amplifier. When the pixel cell is reset, this reset switch is closed (ON). At this moment, the voltage level of the compensation signal $V_{comp}$ is 0V, and the voltage levels of the input signal $V_{in}$ and the reference signal $V_{ref}$ are both $V_{CM}$+AVDD.

In the reset phase, the total charges on the floating nodes x and y may be obtained as follows:

$$q_{ph1,x}=C_{comp1}\cdot(V_{CM}-0)-C_{in1}\cdot[V_{CM}-(V_{CM}+AVDD)]+C_{p1}\cdot V_{CM};$$

$$q_{ph1,y}=C_{comp2}\cdot(V_{CM}-0)-C_{in2}\cdot[V_{CM}-(V_{CM}+AVDD)]+C_{p1}\cdot V_{CM}.$$

Figure 7B:
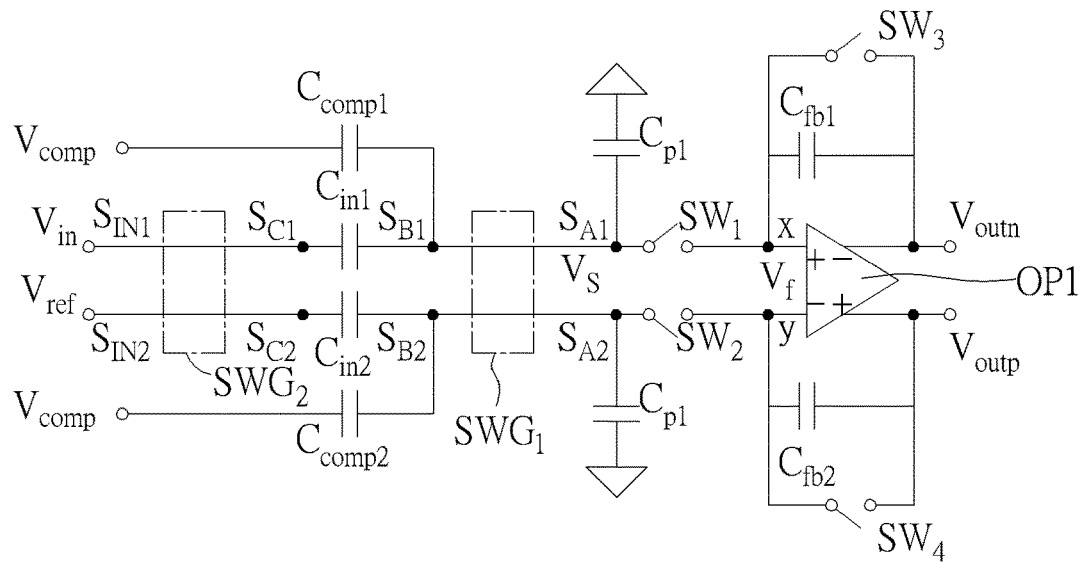

Please refer to FIGS. 7B and 8, where phase A2 is a compensation phase, during which the switches $SW_1$-$SW_4$ are turned off. More specifically, the input switches $SW_1$ and $SW_2$ may turn off the signal paths between the nodes $S_{A1}$ and $S_{A2}$ and the floating nodes x and y, to isolate the input terminals of the amplifier OP1 from the input terminals of the AFE circuit 50 (i.e., to isolate the floating nodes x and y from the nodes $S_{A1}$ and $S_{A2}$, respectively), to prevent the voltage level variation coupled by the input capacitors $C_{in1}$ and $C_{in2}$ in the input signal paths and the compensation capacitors $C_{comp1}$ and $C_{comp2}$ in the compensation paths from influencing the voltage levels of the input terminals of the amplifier OP1. In this phase, a voltage level variation coupled from the compensation path via the compensation capacitors $C_{comp1}$ and $C_{comp2}$ is coupled to the nodes $S_{A1}$ and $S_{A2}$. Therefore, the voltage levels of the input signal $V_{in}$ and the reference signal $V_{ref}$ are both $V_{CM}$+AVDD, and the voltage level of the compensation signal $V_{comp}$ rises from 0V to AVDD. Since the transmitting signal TX is expected to have a falling voltage level −AVDD, the compensation signal $V_{comp}$ is generated accordingly to have a rising voltage level +AVDD, where the variation direction of the compensation signal $V_{comp}$ is opposite to the variation direction of the CM part of the input signal $V_{in}$ generated from the transmitting signal TX, and the absolute amount of the variation of the compensation signal $V_{comp}$ is equal to the absolute amount of the variation of the CM part of the input signal $V_{in}$.

As mentioned above, the compensation signal can be generated according to the CM part of the sensing signal. More specifically, a variation direction of the compensation signal may be arranged opposite to a variation direction of the CM part of the sensing signal. In addition, an absolute amount of the variation of the compensation signal may be arranged substantially equal to an absolute amount of the variation of the CM part of the sensing signal. Examples are shown in FIGS. 7A-7E and FIG. 8, in which the compensation signal $V_{comp}$ has a one-step voltage pumping, i.e., the voltage level of the compensation signal $V_{comp}$ is pumped from 0V to AVDD at a time. The method may also be altered to realize with N-step voltage pumping or rising voltage with a constant slope, so as to achieve multi-step voltage pumping. If the N-step voltage pumping is applied, the compensation signal $V_{comp}$ may be an N-step rising signal comprising N steps, where N is a positive integer greater than or equal to 1. The summation of the N steps of the N-step rising signal may equal the variation amount of the falling voltage level of the CM part of the input signal $V_{in}$, i.e., AVDD. If the rising voltage with a constant slope is applied, the compensation signal $V_{comp}$ may be a ramp voltage. The rising voltage level of the ramp voltage may equal the variation amount of the falling voltage level of the CM part of the input signal $V_{in}$, i.e., AVDD.

Figure 7C:
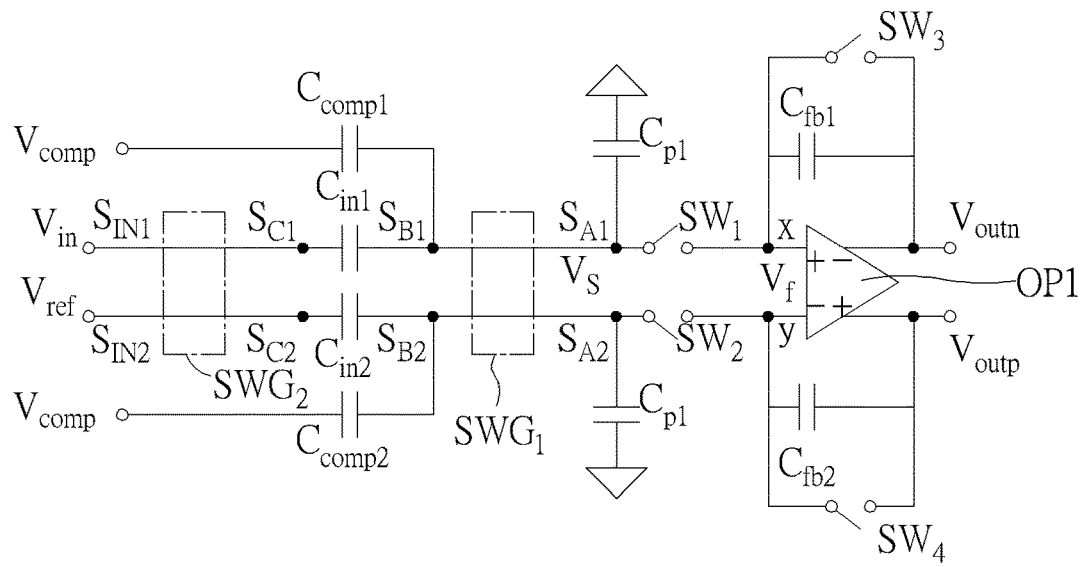
Figure 7D:
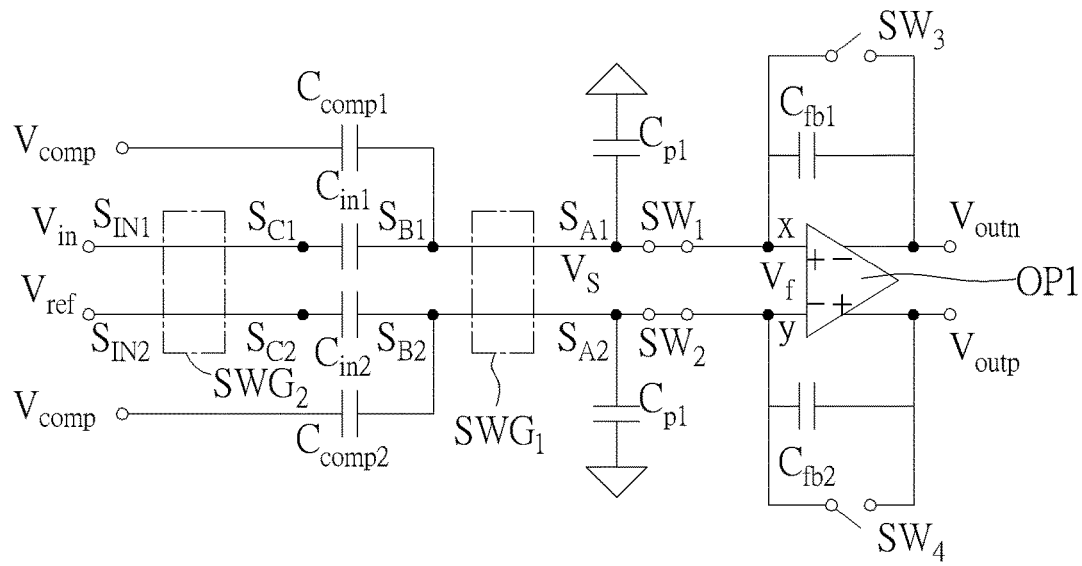
Figure 7E:
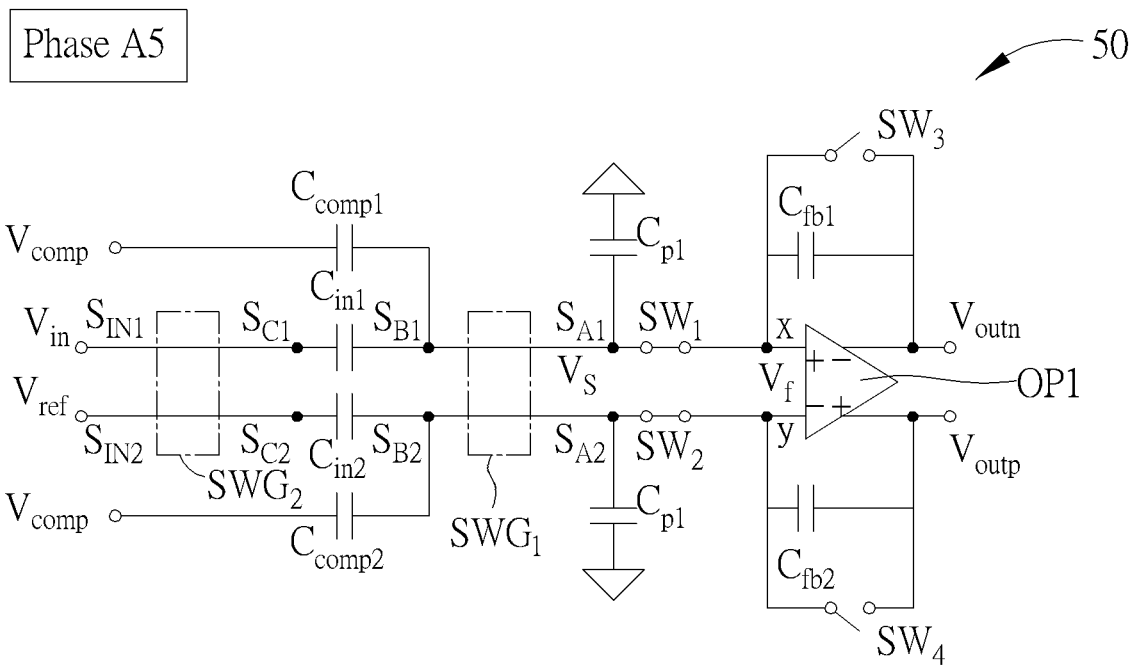

Please refer to FIGS. 7C and 8, where phase A3 is an operation of TX coupling based on the amplitude of the transmitting signal TX, AVDD. In this phase, the voltage level of the transmitting signal TX changes from AVDD to 0V, and the voltage level of the input signal $V_{in}$ changes from $V_{CM}$+AVDD (in phase A2) to $V_{CM}$. In this phase, the floating nodes x and y at the input terminals of the amplifier OP1 are still isolated, i.e., the input switches $SW_1$ and $SW_2$ are turned off. The voltage level variation that the transmitting signal TX changes from AVDD to 0V allows the CM part (which is useless and required to be canceled in the present invention) and the DM part (which is a useful signal) to appear at the output terminal of the pixel cell, as shown in FIG. 2. It is noted that when to generate the DM part at the output terminal of the pixel cell may be determined based on the time point when the reset switches in the charge amplifier circuit are turned off. In the embodiment shown in FIG. 7C, the DM part does not appear yet in phase A3. In this phase, the voltage level of the compensation signal $V_{comp}$ is AVDD, and the voltage levels of the input signal $V_{in}$ and the reference signal $V_{ref}$ are both $V_{CM}$.

During phases A1-A3 where the voltage level variations +$\Delta V_s$ and −$\Delta V_s$ appear at the nodes $S_{A1}$ and $S_{A2}$, the input switches $SW_1$ and $SW_2$ are turned off, which prevents the input terminals of the amplifier OP1 from being influenced by the voltage coupling on the nodes $S_{A1}$ and $S_{A2}$.

In phase A4 (see FIG. 7D), the input switches $SW_1$ and $SW_2$ are turned on, and both of the voltage $V_s$ at the node $S_{A1}$ and the voltage $V_f$ at the floating node x equal $V_{CM}$. The derivation of total charges on the floating nodes x and y in phase A2 to phase A4 are detailed in U.S. application Ser. No. 16/243,105, and will be omitted herein.

In phase A5 (see FIG. 7E), the input switches $SW_1$ and $SW_2$ are turned on. More specifically, the input switches $SW_1$ and $SW_2$ may turn on the signal paths between the nodes $S_{A1}$ and $S_{A2}$ and the floating nodes x and y. The reset switches in the charge amplifier circuit of the pixel cell are turned off, and thus the DM part appears at the output terminal of the pixel cell (i.e., be outputted to the AFE circuit 50 as the DM part of the input signal $V_{in}$). The DM part signal has a shifted voltage level based on the CM part signal, so that the voltage level with respect to the voltage $V_s$ and the voltage $V_f$ becomes $V_{CM}^*$ (different from $V_{CM}$, see FIG. 8). Phase A5 may be considered as a sensing phase where the sensing signal of the pixel cell is received by the AFE circuit 50.

In the sensing phase (phase A5), since the voltage variations received by the AFE circuit 50 have the CM part signal and the DM part signal, the AFE circuit 50 may output a voltage value $V_{swing}$, wherein $V_{outn}=(V_{CM}-0.5 \cdot V_{swing})$ and $V_{outp}=(V_{CM}+0.5 \cdot V_{swing})$.

Therefore, the total charges on the floating node x may be obtained as:

$$q_{ph5,x}=C_{comp1} \cdot (V_{CM}^*-AVDD)+C_{in1} \cdot [V_{CM}^*-(V_{CM}+V_{DM})]+C_{p1} \cdot V_{CM}^*+C_2 \cdot [V_{CM}^*-(V_{CM}-0.5 \cdot V_{swing})]$$

and the total charges on the floating node y may be obtained as:

$$q_{ph5,y}=C_{comp2} \cdot (V_{CM}^*-AVDD)+C_{in2} \cdot [V_{CM}^*-V_{CM}]C_{p1}+V_{CM}^*+C_2 \cdot [V_{CM}^*-(V_{CM}+0.5 \cdot V_{swing})]$$

wherein $V_{CM}$ and $V_{DM}$ are respectively the CM part signal and the DM part signal of the AFE circuit 50, $C_2$ is the capacitance of the feedback capacitors $C_{fb1}$ and $C_{fb2}$, and the terms $C_{p1}$, $C_{in1}$, $C_{in2}$ $C_{comp1}$ and $C_{comp2}$ are capacitances of the corresponding capacitors.

Due to charge conservation from phase A1 to phase A5, the equations are obtained as:

$$q_{ph1,x}=q_{ph5,x};$$

$$q_{ph1,y}=q_{ph5,y};$$

hence, the differential output signal of the AFE circuit 50 may be derived and obtained as follows:

$$(V_{outp} - V_{outn}) = \frac{C_{in1} \cdot (C_{comp2} + C_{in2} + C_{p1} + C_2)}{C_2 \cdot \left( \frac{C_{in1} + C_{in2}}{2} + \frac{C_{comp1} + C_{comp2}}{2} + C_{p1} + C_2 \right)} \cdot V_{DM} - \frac{2 \cdot (C_{in1}C_{comp2} - C_{in2}C_{comp1}) + (C_{p1} + C_2) \cdot [(C_{in1} - C_{in2}) - (C_{comp1} - C_{comp2})]}{C_2 \cdot \left( \frac{C_{in1} + C_{in2}}{2} + \frac{C_{comp1} + C_{comp2}}{2} + C_{p1} + C_2 \right)} \cdot AVDD \quad (1)$$

In Equation (1), the first term is the signal voltage to be amplified, and the second term is the remaining CM voltage generated due to mismatch of capacitors. With process variations, the input capacitors $C_{in1}$ and $C_{in2}$ and the compensation capacitors $C_{comp1}$ and $C_{comp2}$ have different capacitance values that may generate the remaining CM voltage in the differential output signal. As mentioned above, the voltage AVDD is the amplitude of the transmitting signal TX coupled from the pixel cell to the AFE circuit 50 via the input capacitors $C_{in1}$ and $C_{in2}$, and may be canceled with the compensation capacitors $C_{comp1}$ and $C_{comp2}$ and corresponding compensation signals without any mismatch between these four capacitors. If there is a difference or mismatch between the capacitors, the AVDD term may not be perfectly canceled and may remain in the output signal of the AFE circuit 50, as shown in Equation (1). This mismatch will generate a non-ignorable voltage deviation in the output signal of the AFE circuit 50.

In order to cancel the remaining CM voltage, the swap switch groups $SWG_1$ and $SWG_2$ may be switched between the non-swapping configuration and the swapping configuration, so that the CM voltage in the differential output signal may be averaged between the non-swapping phase and the swapping phase.

In the abovementioned operations, the AFE circuit 50 operates from phase A1 to phase A5 under the non-swapping phase where the swap switch groups $SWG_1$ and $SWG_2$ are in the non-swapping configuration. Subsequently, the non-swapping phase ends and the swapping phase starts, and the swap switch groups $SWG_1$ and $SWG_2$ are switched to be in the swapping configuration as shown in FIG. 6B. In the swapping phase, the AFE circuit 50 may operate from phase B1 to phase B5 which are similar to phase A1 to phase A5, respectively. As shown in FIGS. 9A-9E, in phase B1 to phase B5, the statuses of the input switch group $SW_1$-$SW_2$ and the feedback switch group $SW_3$-$SW_4$ and the signal coupling are identical to those in phase A1 to phase A5, except for different configurations of the swap switch groups $SWG_1$ and $SWG_2$. In other words, the AFE circuit 50 undergoes similar operations in the non-swapping phase and the swapping phase, to generate similar output signals described as Equation (1).

Assume that process variation results in a difference ε in the capacitance value between the input capacitors $C_{in1}$ and $C_{in2}$ and the compensation capacitors $C_{comp1}$ and $C_{comp2}$. As shown in FIGS. 6A and 7A-7E, in the non-swapping phase (phases A1-A5), the signal path passing the input signal $V_{in}$ at the input node $S_{IN1}$ has the input capacitor $C_{in1}$ which has a capacitance value $C_1 \cdot (1+\varepsilon)$, and the corresponding compensation path has the compensation capacitor $C_{comp1}$ which has a capacitance value $C_1$. The signal path passing the reference signal $V_{ref}$ at the input node $S_{IN2}$ has the input capacitor $C_{in2}$ which has a capacitance value $C_1$, and the corresponding compensation path has the compensation capacitor $C_{comp2}$ which has a capacitance value $C_1 \cdot (1+\varepsilon)$. As shown in FIGS. 6B and 9A-9E, in the swapping phase (phases B1-B5), due to the signal path swapping, the capacitor on the signal path passing the input signal $V_{in}$ at the input node $S_{IN1}$ becomes the input capacitor $C_{in2}$ which has a capacitance value $C_1$, and the capacitor on the corresponding compensation path becomes the compensation capacitor $C_{comp2}$ which has a capacitance value $C_1 \cdot (1+\varepsilon)$. The capacitor on the signal path passing the reference signal $V_{ref}$ at the input node $S_{IN2}$ becomes the input capacitor $C_{in1}$ which has a capacitance value $C_1 \cdot (1+\varepsilon)$, and the capacitor on the corresponding compensation path becomes the compensation capacitor $C_{comp1}$ which has a capacitance value $C_1$.

The capacitance values in the non-swapping phase and the swapping phase are substituted into Equation (1) and obtain:

$$(V_{outp} - V_{outn}) = \frac{0.5 \cdot (2+\varepsilon) \cdot C_1}{C_2} \cdot V_{DM}. \quad (2)$$

It can be shown that there is no CM component (i.e., the AVDD term) included in Equation (2).

Figure 10:
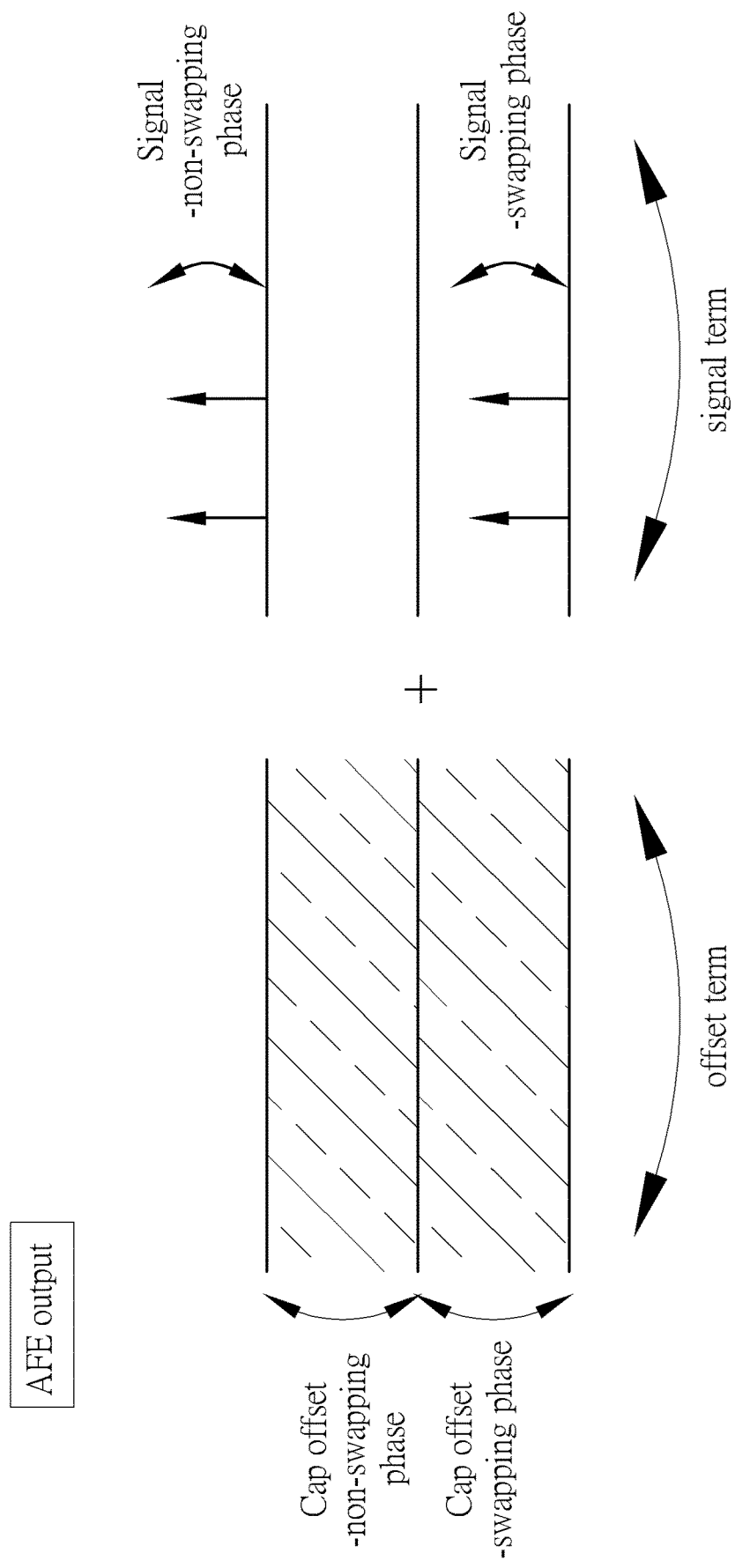
FIG. 10 is a schematic diagram of the AFE output signals in the non-swapping phase and the swapping phase.

As shown in the above equations, the remaining CM voltage due to capacitor mismatch may be canceled after averaging the output signal $(V_{outp}-V_{outn})$ of the AFE circuit 50 in the non-swapping phase and the swapping phase, and the signal voltage to be processed is the average result of the output signal of the AFE circuit 50 in the non-swapping phase and the swapping phase. Therefore, the AFE circuit 50 may be continuously switched between the non-swapping phase and the swapping phase, i.e., the swap switch groups $SWG_1$ and $SWG_2$ may be continuously switched between the non-swapping configuration and the swapping configuration, to respectively generate a first output signal in the non-swapping phase and a second output signal in the swapping phase. Therefore, the first output signal and the second output signal may be averaged to remove the CM voltage component in the output signals. As shown in FIG. 10, the AFE output signals in the non-swapping phase and the swapping phase include an offset part and a signal part. Their offset parts have inverse polarities and their signal parts have the same polarity. After the average operation on the AFE output signals, the offset parts in the output signals may be entirely canceled; hence, the finally output signal after average may accurately reflect the DM signal of the pixel cell output.

Figure 11:
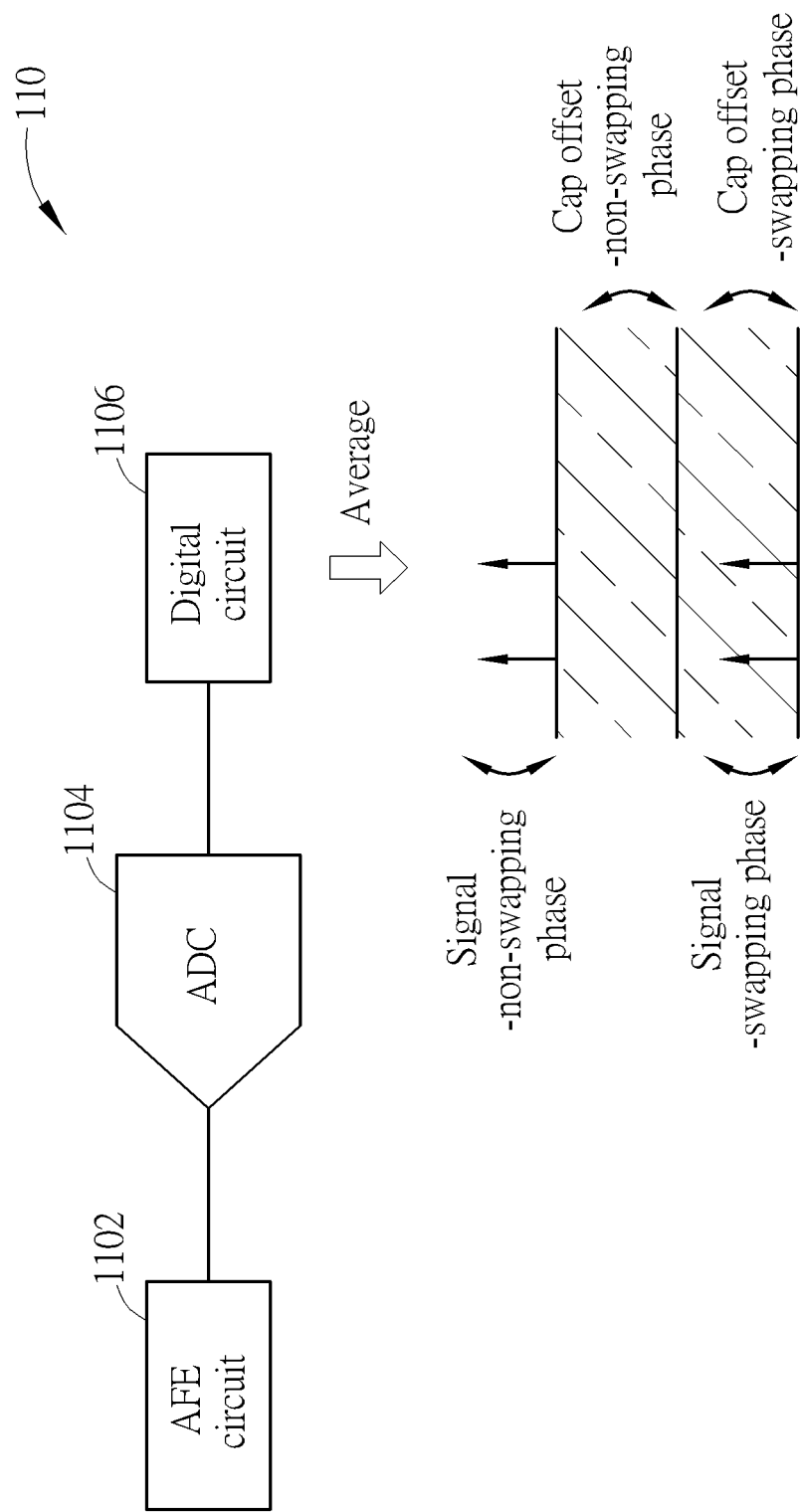
FIG. 11 is a schematic diagram of a signal processing system according to an embodiment of the present invention.

Please refer to FIG. 11, which is a schematic diagram of a signal processing system 110 according to an embodiment of the present invention. The signal processing system 110 may be coupled to a pixel cell of a sensor such as the pixel cell shown in FIG. 1, for processing the output signal of the pixel cell. As shown in FIG. 11, the signal processing system 110 includes an AFE circuit 1102, an analog to digital converter (ADC) 1104 and a digital circuit 1106. The AFE circuit 1102 may be implemented as the AFE circuit 50 shown in FIG. 5, which operates in the non-swapping phase and the swapping phase alternately to generate output signals to be averaged. Subsequently, the ADC 1104 converts the output signals into corresponding digital codes. The digital codes corresponding to the non-swapping phase and the swapping phase may thereby be averaged in the digital circuit 1106. As a result, the remaining CM voltage (i.e., the offset term) due to capacitor mismatch may be fully eliminated, and only the signal term remains. The finally obtained signal may be the average result of the non-swapping phase and the swapping phase, as shown in FIG. 11.

Please note that the embodiments of the present invention aim at providing a signal processing circuit and system capable of processing a sensing signal from the fingerprint sensor, for perfectly removing the CM part of the sensing signal by swapping the switch configuration and averaging the output signals. Those skilled in the art may make modifications and alternations accordingly. For example, in the embodiment shown in FIGS. 7A-7E, the DM part signal appears at the input signal $V_{in}$ (i.e., from the output terminal of the pixel cell) in phase A5. In another embodiment of the present invention, the DM part signal may appear earlier in phase A3 or phase A4 without influencing the voltage offset effects on the nodes $S_{A1}$ and $S_{A2}$. In addition, the embodiments of the present invention are applicable to a fingerprint sensor, where the input signal of the AFE circuit may be a fingerprint signal received from the fingerprint sensor of a touch panel. This should not be a limitation of the present invention, and the signal processing circuit and system of the present invention are also applicable to other types of signals. Further, each of the swap switch groups may be implemented in any manners. In an embodiment, a swap switch group may include four switches, each of which coupled between one of the two front terminals and one of the two back terminals of the swap switch group. Alternatively, a swap switch group may be realized with selectors or multiplexers, where a selector or multiplexer may be configured to couple a front terminal to one of the back terminals of the swap switch group, or configured to couple a back terminal to one of the front terminals of the swap switch group. The detailed implementations of the swap switch group should not limit the scope of the present invention.

Figure 12:
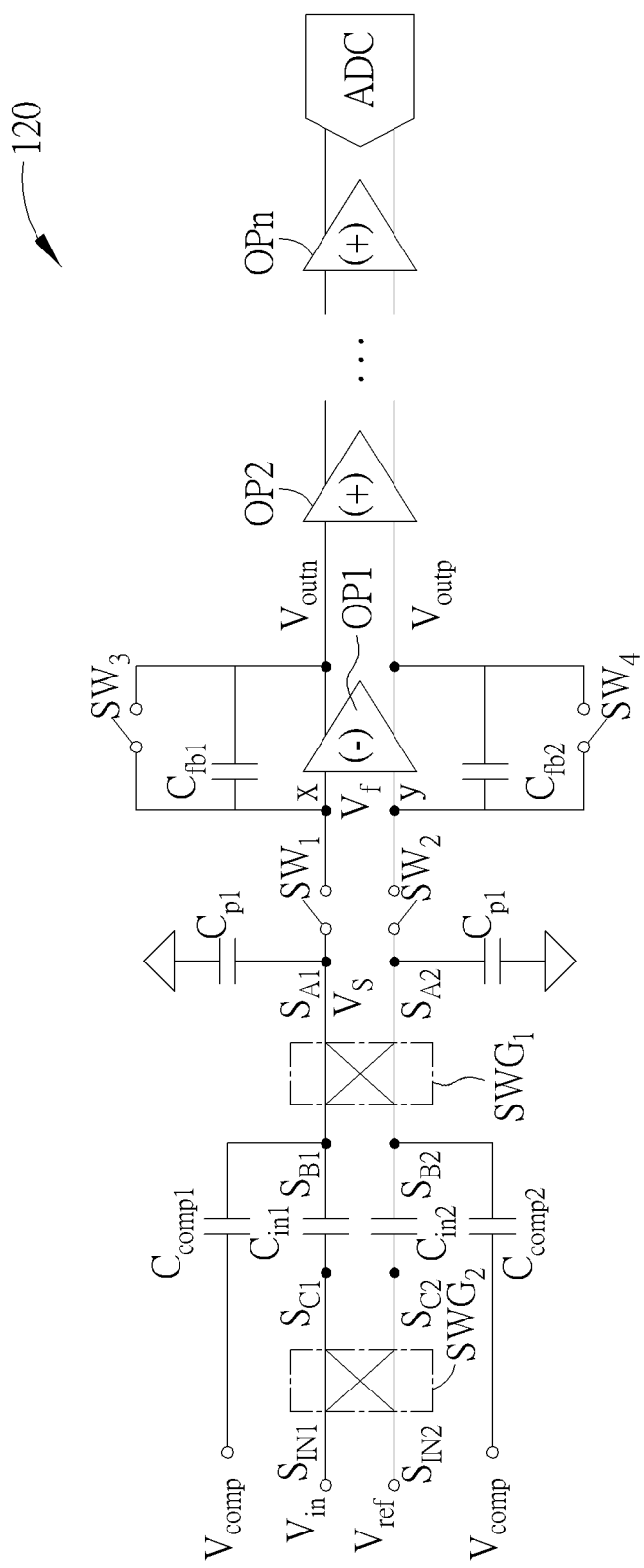
FIG. 12 is a schematic diagram of another AFE circuit according to an embodiment of the present invention.

In another embodiment, the swap switch groups may be disposed at other positions of the signal path to realize signal path swapping. Please refer to FIG. 12, which is a schematic diagram of another AFE circuit 120 according to an embodiment of the present invention. An ADC, which may be or may not be included in the AFE circuit 120, is also illustrated in FIG. 12. The circuit structure of the AFE circuit 120 is similar to the circuit structure of the AFE circuit 50, so signals and elements having similar functions are denoted by the same symbols. The sensed voltage signal from the pixel array of a fingerprint sensor may pass through the AFE circuit 120 and then be received by the ADC.

In order to increase the signal strength and facilitate the conversion of ADC, the AFE circuit 120 includes multiple stages of operational amplifiers (OP1~OPn). The voltage signal may be amplified by the operational amplifier stages and then enter the ADC to generate the digital code. In general, the ADC may be configured to receive voltages in positive polarity, and a larger received voltage will output a larger digital code. However, the voltage signal received from the pixel array of the fingerprint sensor may usually be in negative polarity since the larger the sensed finger capacitance is, the lower the voltage level of the sensed voltage signal is, as shown in FIG. 2. Therefore, the AFE circuit may include an operational amplifier with inverse polarity (where the polarity of the output signal is inverse to the polarity of the input signal, such as OP1, as denoted by (−)), to change the polarity of the sensed voltage signal to let the signal outputted to the ADC to be in positive polarity. Other operational amplifiers may have non-inverse polarity, as denoted by (+).

In this embodiment, the two swap switch groups $SWG_1$ and $SWG_2$ disposed in the signal path may maintain the voltage signal outputted to the ADC in positive polarity in both the non-swapping phase and the swapping phase. In another embodiment, the swap switch group $SWG_2$ may be disposed in another position of the signal path, which may be, but is not limited to, between OP1 and OP2, in back of OP2, or in front of OPn.

FIG. 12 illustrates an exemplary circuit where the ADC outputs a larger digital code when receiving a larger voltage in positive polarity. However, in another embodiment, the ADC may be configured to output a larger digital code when receiving a larger voltage in negative polarity, as long as the signal received by the ADC has the same polarity in both the non-swapping phase and the swapping phase. In the AFE circuit 120 shown in FIG. 12, the first stage operational amplifier OP1 is in inverse polarity and other operational amplifiers in follow-up stages are in non-inverse polarity, while in another embodiment, the first stage operational amplifier OP1 does not need to be limited in inverse polarity and may be in non-inverse polarity instead, and one of the operational amplifiers in follow-up stages is implemented in inverse polarity, to achieve a correct polarity configuration in the AFE circuit 120.

Figure 13:
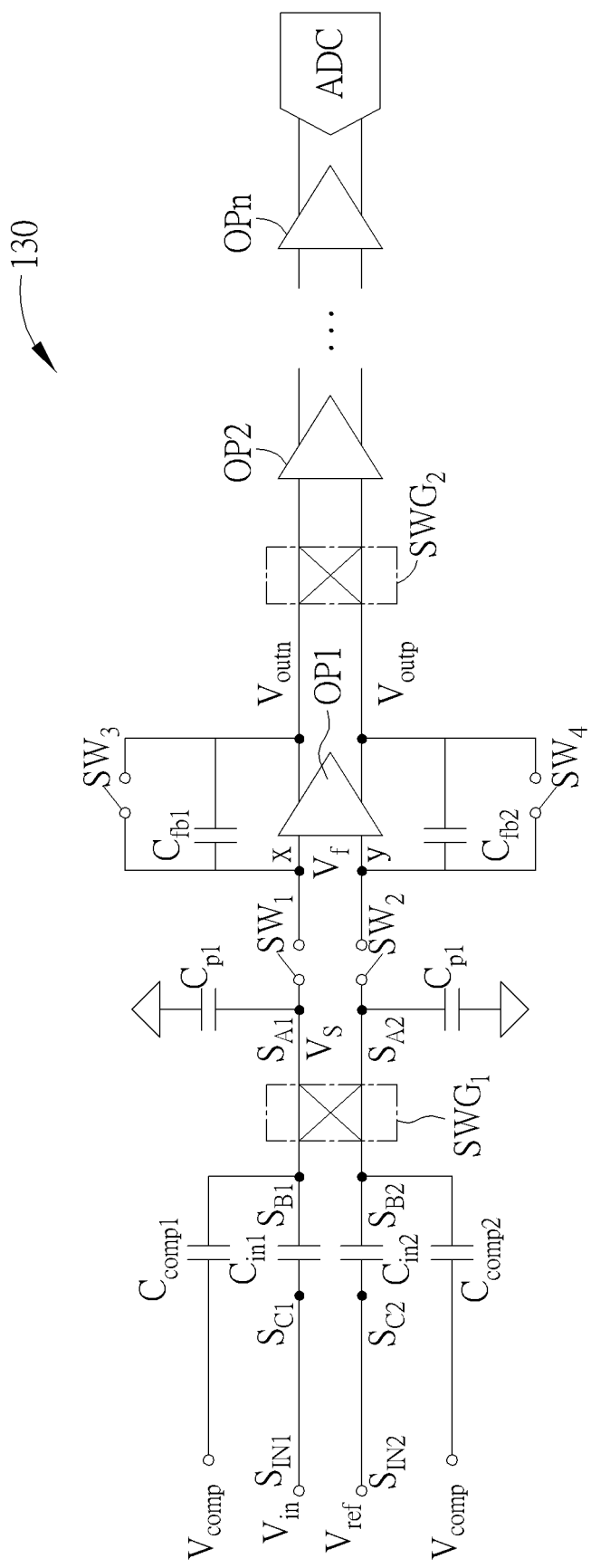
FIG. 13 is a schematic diagram of a further AFE circuit according to an embodiment of the present invention.

FIG. 13 illustrates a further AFE circuit 130 according to an embodiment of the present invention. As shown in FIG. 13, the circuit structure of the AFE circuit 130 is similar to the circuit structure of the AFE circuit 120, so signals and elements having similar functions are denoted by the same symbols. The difference between the AFE circuit 130 and the AFE circuit 120 is that, the swap switch group $SWG_2$ is disposed between the operational amplifiers OP1 and OP2 instead of in front of the input capacitors $C_{in1}$ and $C_{in2}$. The operational amplifiers may also be implemented in an appropriate manner to have a correct polarity configuration.

To sum up, the embodiments of the present invention provide a signal processing circuit and system capable of processing a sensing signal from a sensor, for entirely removing the CM part of the sensing signal by swapping the switch configuration and averaging the output signals. The signal processing circuit may be an AFE circuit that receives the sensing signal from a sensor. In detail, two swap switch groups may be included in the AFE circuit. In a non-swapping phase, the swap switch groups may operate in the non-swapping configuration; and in a swapping phase, the swap switch groups may operate in the swapping configuration. An output signal of the AFE circuit obtained in the non-swapping phase and an output signal of the AFE circuit obtained in the swapping phase may be averaged in digital domain, so that the CM voltage remaining in the output signals due to mismatch of the input capacitors and compensation capacitors may be entirely canceled. Therefore, the useless CM part may be removed from the output signal, and thus the output signal may accurately reflect the sensed fingerprint signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, for processing a sensing signal from a sensor, the signal processing circuit comprising:
    an amplifier, coupled to a first floating node and a second floating node, for amplifying the sensing signal coupled from the first floating node and the second floating node, wherein the first floating node and the second floating node are coupled to two input terminals of the amplifier, respectively;
    a first switch group, coupled between a first node group and the first floating node and the second floating node;
    a second switch group, coupled between a second node group and the first node group;
    an input capacitor group, coupled to the second node group and an input node group, and configured to receive the sensing signal coupled from the input node group; and
    a compensation capacitor group, coupled between a compensation node group and the second node group, and configured to receive a compensation signal coupled from the compensation node group.

2. The signal processing circuit of claim 1, wherein there exists at least one compensation phase and a sensing phase following the compensation phase, wherein during the at least one compensation phase the first switch group is configured to turn off a plurality of signal paths between the first node group and the first and second floating nodes, and during the sensing phase the first switch group is configured to turn on the plurality of signal paths between the first node group and the first and second floating nodes.

3. The signal processing circuit of claim 2, wherein there further exists a reset phase before the at least one compensation phase, and during the reset phase the first switch group is configured to turn on the plurality of signal paths between the first node group and the first and second floating nodes.

4. The signal processing circuit of claim 2, wherein each of the at least one compensation phase comprises a non-swapping phase and a swapping phase, wherein in the non-swapping phase, the second switch group is in a non-swapping configuration, and in the swapping phase, the second switch group is in a swapping configuration.

5. The signal processing circuit of claim 2, wherein the sensing phase comprises a non-swapping phase and a swapping phase, wherein in the non-swapping phase, the second switch group is in a non-swapping configuration, and in the swapping phase, the second switch group is in a swapping configuration.

6. The signal processing circuit of claim 3, wherein the reset phase comprises a non-swapping phase and a swapping phase, wherein in the non-swapping phase, the second switch group is in a non-swapping configuration, and in the swapping phase, the second switch group is in a swapping configuration.

7. The signal processing circuit of claim 1, wherein the second switch group is capable to be switched between a non-swapping configuration and a swapping configuration.

8. The signal processing circuit of claim 7, wherein in the non-swapping configuration, the second switch group is configured to couple a first node of the second node group to a first node of the first node group and couple a second node of the second node group to a second node of the first node group, and wherein in the swapping configuration, the second switch group is configured to couple the first node of the second node group to the second node of the first node group and couple the second node of the second node group to the first node of the first node group.

9. The signal processing circuit of claim 1, further comprising a third switch group coupled between the input node group and a third node group which is coupled the input capacitor group, and being capable to be switched between a non-swapping configuration and a swapping configuration.

10. The signal processing circuit of claim 9, wherein in the non-swapping configuration, the third switch group is configured to couple a first node of the input node group to a first node of the third node group and couple a second node of the input node group to a second node of the third node group, and wherein in the swapping configuration, the third switch group is configured to couple the first node of the input node group to the second node of the third node group and couple the second node of the input node group to the first node of the third node group.

11. The signal processing circuit of claim 1, wherein the compensation capacitor group and the first switch group are configured to cancel a common-mode part of the sensing signal, and the second switch group is configured to compensate the mismatch of capacitors of the input capacitor group and the compensation capacitor group.

12. The signal processing circuit of claim 1, wherein the input capacitor group, the compensation capacitor group and the first switch group are configured to maintain the first and second floating nodes at a constant voltage level.

13. The signal processing circuit of claim 1, wherein the compensation signal is generated according to a common-mode part of the sensing signal.

14. The signal processing circuit of claim 13, wherein a variation direction of the compensation signal is opposite to a variation direction of the common-mode part of the sensing signal.

15. The signal processing circuit of claim 13, wherein an absolute amount of the variation of the compensation signal is equal to an absolute amount of the variation of the common-mode part of the sensing signal.

16. The signal processing circuit of claim 1, wherein the sensing signal is a fingerprint sensing signal.

17. A signal processing system, for processing a sensing signal from a sensor, the signal processing system comprising:
- a signal processing circuit, comprising:
    - an amplifier, coupled to a first floating node and a second floating node, for amplifying the sensing signal coupled from the first floating node and the second floating node, wherein the first floating node and the second floating node are coupled to two input terminals of the amplifier, respectively;
    - a first switch group, coupled between a first node group and the first floating node and the second floating node;
    - a second switch group, coupled between a second node group and the first node group;
    - an input capacitor group, coupled to the second node group and an input node group, and configured to receive the sensing signal coupled from the input node group; and
    - a compensation capacitor group, coupled between a compensation node group and the second node group, and configured to receive a compensation signal coupled from the compensation node group;
- an analog to digital converter (ADC), coupled to the signal processing circuit; and
- a digital circuit, coupled to the ADC.

18. The signal processing system of claim 17, wherein there exists a reset phase, at least one compensation phase following the reset phase and a sensing phase following the compensation phase, wherein during the reset phase the first switch group is configured to turn on a plurality of signal paths between the first node group and the first and second floating nodes, during the at least one compensation phase the first switch group is configured to turn off the plurality of signal paths between the first node group and the first and second floating nodes, and during the sensing phase the first switch group is configured to turn on the plurality of signal paths between the first node group and the first and second floating nodes.

19. The signal processing system of claim 18, wherein each of the reset phase, the at least one compensation phase and the sensing phase comprises a non-swapping phase and a swapping phase, wherein in the non-swapping phase, the second switch group is in a non-swapping configuration, and in the swapping phase, the second switch group is in a swapping configuration.

20. The signal processing system of claim 19, wherein in the non-swapping configuration, the second switch group is configured to couple a first node of the second node group to a first node of the first node group and couple a second node of the second node group to a second node of the first node group, and wherein in the swapping configuration, the second switch group is configured to couple the first node of the second node group to the second node of the first node group and couple the second node of the second node group to the first node of the first node group.

21. The signal processing circuit of claim 17, wherein the compensation capacitor group and the first switch group are configured to cancel a common-mode part of the sensing signal, and the second switch group is configured to compensate the mismatch of capacitors of the input capacitor group and the compensation capacitor group.

22. The signal processing circuit of claim 17, wherein the sensing signal is a fingerprint sensing signal.

* * * * *